United States Patent [19]

Cote et al.

[11] Patent Number: 4,838,991
[45] Date of Patent: Jun. 13, 1989

[54] PROCESS FOR DEFINING ORGANIC SIDEWALL STRUCTURES

[75] Inventors: William J. Cote, Essex Junction; Donald M. Kenney, Shelburne; Michael L. Kerbaugh, Burlington; Michael A. Leach, Winooski; Jeffrey A. Robinson; Robert W. Sweetser, both of Essex Junction, all of Vt.

[73] Assignee: International Business Machines Corporation, Armonk, N.Y.

[21] Appl. No.: 218,515

[22] Filed: Jun. 20, 1988

Related U.S. Application Data

[63] Continuation of Ser. No. 114,960, Oct. 30, 1987, abandoned.

[51] Int. Cl.⁴ .................. B44C 1/22; B29C 37/00; C03C 15/00; C03C 25/06
[52] U.S. Cl. .................. 156/643; 156/646; 156/648; 156/652; 156/655; 156/659.1; 156/668; 204/192.36; 437/228; 437/235
[58] Field of Search .............. 156/643, 646, 648, 652, 156/655, 659.1, 661.1, 668; 430/312, 314, 317; 437/40, 41, 61, 63, 80, 203, 228, 229, 235; 204/192.32, 192.35, 192.36

[56] References Cited

U.S. PATENT DOCUMENTS

| | | | |
|---|---|---|---|
| 4,256,514 | 3/1981 | Pogge | 148/1.5 |
| 4,259,369 | 3/1981 | Canavello et al. | 427/155 |
| 4,502,914 | 3/1985 | Trumpp et al. | 156/643 |
| 4,599,790 | 7/1986 | Kim et al. | 29/571 |
| 4,600,686 | 7/1986 | Meyer et al. | 430/326 |
| 4,631,113 | 12/1986 | Donald | 156/659.1 |
| 4,648,937 | 3/1987 | Ogura et al. | 156/643 |
| 4,707,218 | 11/1987 | Giammarco et al. | 156/643 |

FOREIGN PATENT DOCUMENTS

| | | |
|---|---|---|
| 0010596 | 9/1979 | European Pat. Off. |
| 0150597 | 12/1984 | European Pat. Off. |
| 59-163829 | 9/1984 | Japan |
| 59-197137 | 11/1984 | Japan |
| 62-106456 | 5/1987 | Japan |

OTHER PUBLICATIONS

"Fabrication of a Sub-Minimum Lithography Trench," *IBM Technical Disclosure Bulletin*, vol. 29, No. 6, Nov. 1986, pp. 2760, 2761.

"Advanced Groundrule Processing Performed with Currently Available Photo-Lithographic Tools," *IBM Technical Disclosure Bulletin*, vol. 29, No. 9, Feb. 1987, pp. 3928-3929.

"Self-Aligned VMOS Structure Using Reactive Ion Etching," R. C. Varshney, *IBM TDB*, vol. 22, No. 8B, Jan. 1980, pp. 3705-3706.

*Primary Examiner*—William A. Powell
*Attorney, Agent, or Firm*—Mark F. Chadurjian

[57] ABSTRACT

A conformal organic layer is used to define spacers on the sidewalls of an organic mandrel. The organic layer (e.g., parylene) can be deposited at low temperatures, and as such is compatible with temperature-sensitive mandrel materials that reflow at high deposition temperatures. The conformal organic material can be dry etched as the same rate as the organic mandrels, while being resistant to wet strip solvents that remove the organic mandrels. This series of etch characteristics make the organic mandrel-organic spacer combination compatible with a host of masking applications.

4 Claims, 2 Drawing Sheets

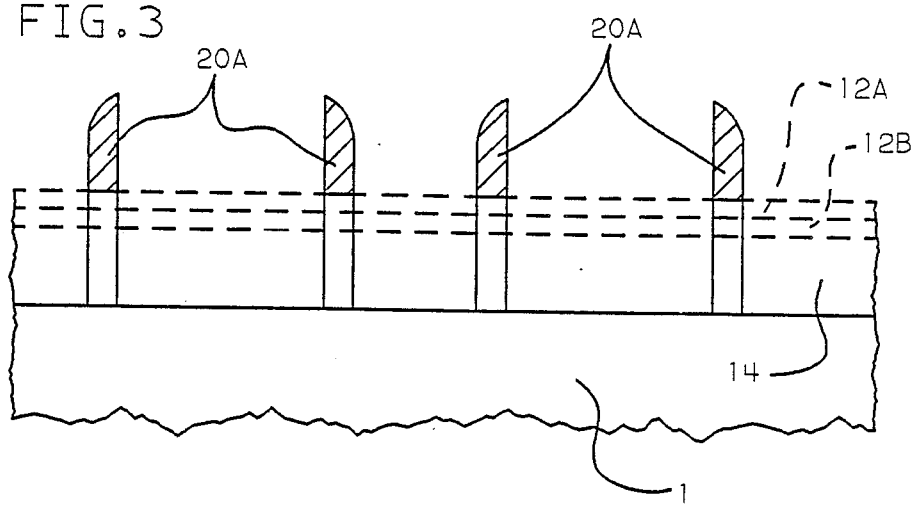
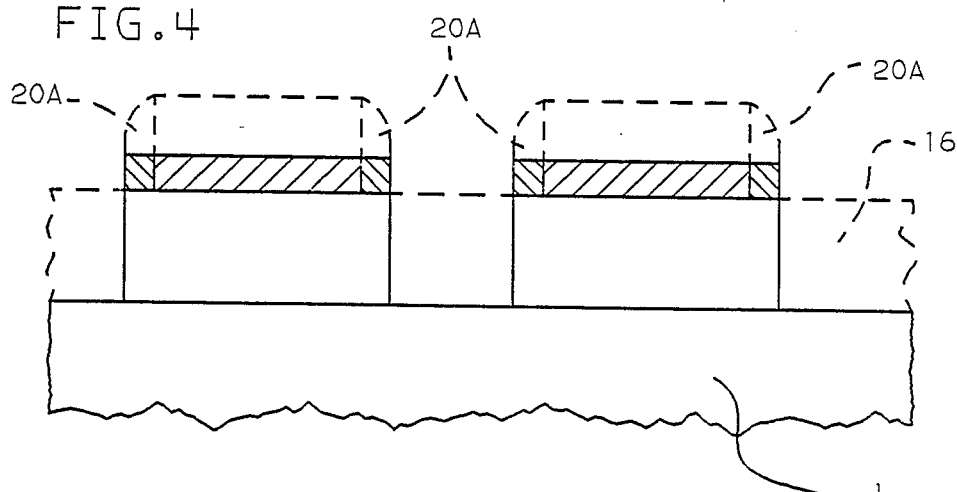
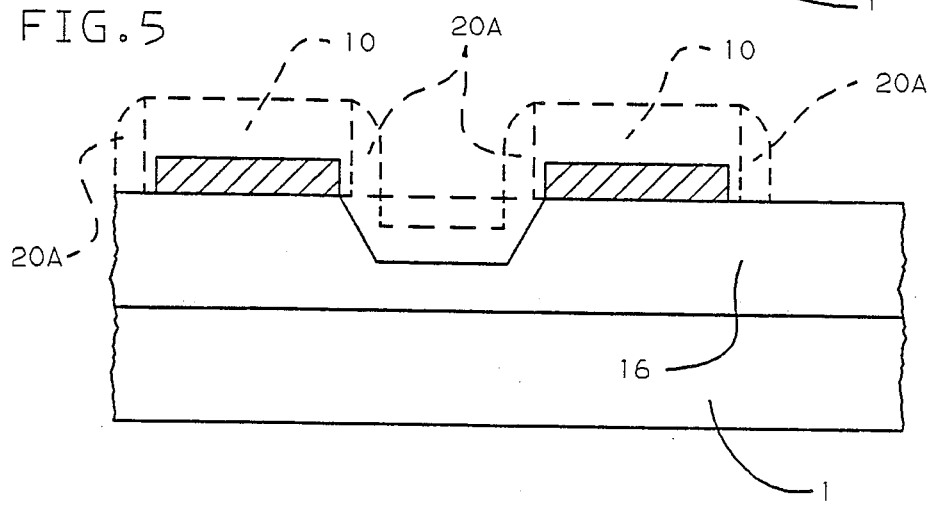

PROCESS FOR DEFINING ORGANIC SIDEWALL STRUCTURES

This is a continuation of co-pending application Ser. No. 114,960, filed on Oct. 30, 1987, now abandoned.

CROSS-REFERENCE TO RELATED APPLICATION

Reference is made to U.S. patent application Ser. No. 924,233, entitled "Lithographic Image Size Reduction," filed Oct. 28, 1986, by Beyer et al, now U.S. Pat. No. 4,707,218, and assigned to the assignee of the invention. The application relates to the general idea of using inorganic conformal layers to define sidewall spacers on vertically-imaged photoresist. The spacers define images having an area less than the images normally printed by the photolithographic exposure system.

BACKGROUND ART

Over the past several years, many different methods have been proposed in the integrated circuit processing art for forming sub-micron images. Most of these methods rely on state-of-the-art photolithographic tooling. Other methods rely on more exotic exposure systems (e.g., X-ray, E-beam, etc.). Whichever of the above exposure systems are used, its source intensity, beam focus, and other parameters combine to establish a minimum feature size that can be reliably printed.

Recently, efforts have been made to extend the useful life of optical tooling that produces images that are too large for present-day applications. One method of supplementing these minimum images is by the use of sidewall structures. In this technology, a conformal layer is coated on a "mandrel," which is a block of material typically having substantially vertical sidewalls. The conformal layer is then etched in an anisotropic mode, so that portions thereof laying on horizontal surfaces (e.g., the upper surface of the mandrel) are removed. Portions of the conformal layer disposed on vertical surfaces (e.g., the sidewalls of the mandrel) remain to form the sidewall spacers. In some applications, the sidewall-coated mandrels are used as a mask to define an image in underlaying layers. See an article by Varshney, entitled "Self-Aligned VMOS Structure Using Reactive Ion Etching," *IBM Technical Disclosure Bulletin*, Vol. 22, No. 8, January 1980, pp. 3705–3706, wherein an oxide mandrel is coated with a conformal oxide layer that is etched to define oxide spacers, the mandrel-spacer composite defining an image in underlaying silicon layers. In other applications, the mandrel is removed, without removing the spacers, and the spacers define an image. See e.g, U.S. Pat. No. 4,502,914 entitled "Method of Making Structures with Dimensions in the Submicrometer Range," issued Mar. 5, 1985 to Trump et al and assigned to the assignee of the present invention. A conformal layer of silicon oxide or silicon nitride is coated on a polymeric mandrel. After spacers are defined on the sidewalls of the mandrel, the mandrel is removed and the spacers serve as masks to etch deep trenches in the underlaying silicon substrate.

As shown by the above references, the respective compositions of the conformal layer and the mandrel are determined by the particular masking application of the resulting structure. In applications in which the mandrel-spacer combination serves as a mask, both materials must be resistant to the etchant that patterns the underlaying layers. In applications in which only the spacer is used as a mask, the mandrel must be made of a material that can be etched without appreciably attacking the spacers.

The above references utilize silicon oxide and silicon nitride as the conformal layers that define the sidewall spacers. Both of these materials are typically deposited at temperatures of 175° C. and above. Organic mandrel structures (e.g., photoresist) may begin to reflow at these high deposition temperatures. Moreover, when these layers are deposited on oxide or nitride passivation layers, such layers may be etched during definition of the spacers. In the above referenced U.S. Pat. No. 4,707,218, this shortcoming was addressed by incorporating an etch-stop layer on the passivation layer.

Accordingly, it would be advantageous to use the same mandrel-spacer combination for each of the above applications, while avoiding the high deposition temperatures and overetch problems attendant with conventional conformal layers.

SUMMARY OF THE INVENTION

It is thus an object of the present invention to provide a process for supplementing the photolithographic limits of image exposure tools.

It is another object of the invention to provide a mandrel-spacer combination that can be used in a plurality of patterning applications.

It is another object of the invention to provide spacers on organic mandrels without exposing the mandrels to high processing temperatures.

These and other objects of the invention are realized by a process in which a conformal organic layer is deposited at room temperature on organic mandrel structures. The resulting mandrel-spacer pair is compatible with a plurality of patterning applications. That is, the mandrel spacer combination can be used as a composite mask, or the mandrel may be removed without appreciably removing the organic spacers such that the spacers alone can serve as a mask. The organic layer may be patterned without appreciably etching underlaying passivation layers.

BRIEF DESCRIPTION OF THE DRAWINGS

The foregoing and other structures and teachings of the present invention will become more apparent upon a description of the best mode for carrying out the invention as rendered below. In the description to follow, reference will be made to the accompanying Drawing, in which:

FIG. 3 is a cross-sectional view of a substrate undergoing a process in accordance with a first embodiment of the invention;

FIG. 4 is a cross-sectional view of a substrate undergoing a process in accordance with a second embodiment of the invention; and FIG. 5 is a cross-sectional view of a substrate undergoing a process in accordance with a third embodiment of the invention.

DETAILED DESCRIPTION OF THE BEST MODE FOR CARRYING OUT THE INVENTION

Figure 1:
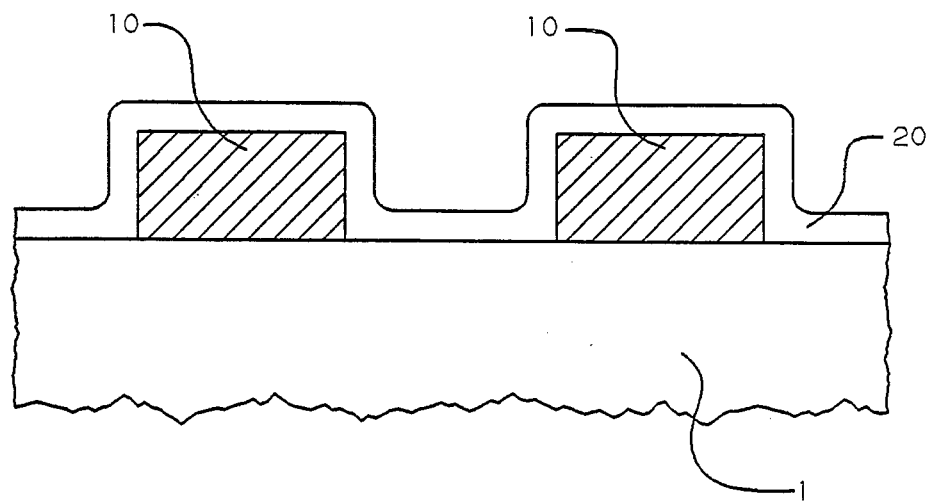
FIGS. 1–2 are cross-sectional views of a substrate undergoing the process steps of the invention.

As shown in FIG. 1, a conformal organic layer 20 is coated on mandrels 10 formed on a substrate 1. The substrate 1 is shown as being a single block of material for ease of illustration. As shown in FIGS. 3–5, the process of the invention can be carried out on a semiconductor or insulator substrate having one or more conductive, semiconductive, and/or insulative layers disposed on its upper surface. The mandrels 10 are formed from an organic resinous material. For example, any commercially available polyimide (e.g., "PI 2555," available from the DuPont Corp. of Wilmington, Del.) could be used. Alternatively, any commercially available photosensitive polymer (e.g., "AZ 1350J" sold by AZ Photoresist Products Group of American Hoechst Corp. Summerville, N.J. "AZ 1350J" being a trademark of American Hoechst Corp.) could be used. If polyimides are used, a blanket layer of polyimide is deposited and is imagewise exposed through a patterned photoresist layer. The exposed portions of the polyimide layer are then removed by exposure to an anisotropic $O_2$ gaseous plasma. However, as will be described in more detail below, it is preferred to use a photosensitive polymer to provide the mandrel structures.

The conformal organic layer can be made from any organic material that can be conformally deposited at low temperature. One such material is poly-p-xylylene, or "parylene." In carrying out the experiments associated with the invention, parylene was deposited using the following process. The wafers were vertically oriented within a conventional tube reactor, so that the di-p-xylylene gas flow was perpendicular to the wafers and centered within the reactor. The reactor pressure was maintained at 50 mTorr. In order to minimize turbulence within the reactor, the gas outlet valve was maintained at its minimum "open" setting. In practice, parylene layers of up to 0.7 μm in thickness have been conformally coated at room temperature on 1.6 micron mandrels having sidewall slopes of greater than 80°.

Parylene presents several beneficial materials characteristics. Because parylene is deposited at room temperature and because the subsequent etch steps are also carried out at low temperature, there is no need to "harden" the photoresist mandrels 10 by exposure to a 200° C.–250° C. heating step as, required in the aforementioned U.S. Pat. No. 4,707,218.

Moreover, parylene is more conformal (on the order of 95% conformality) than the silicon oxide and silicon nitride layers used in the prior art. The parylene deposition is a surface rate limited reaction, which by its very nature is a highly conformal process.

Figure 2:
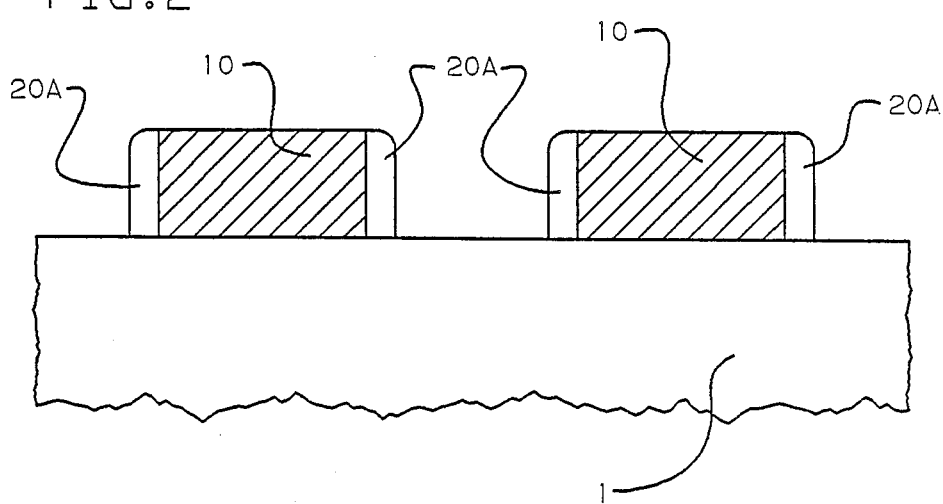

As shown in FIG. 2, the organic parylene layer 20 is then anisotropically etched to provide spacers 20A on the sidewalls of the mandrels 10. Spacers 20A are defined by anisotropically etching the parylene layer 20 in an anisotropic $O_2$ gaseous plasma. The plasma is held at conventional anisotropic reactive ion etch conditions (e.g., less than 10–20 milliTorr pressure and approximately 400 volts DC). During the course of this anisotropic etch, upper portions of the mandrels 10 may also be eroded However, because the thickness of the mandrels is typically much greater than the thickness of the conformal layer, some etching of the mandrels may occur without deleteriously affecting the operation of the invention. Moreover, since neither oxides nor nitrides are appreciably etched in $O_2$ plasmas, there is no need to protect underlaying oxide and/or nitride passivation layers by interposing an etch-stop.

It has been found that the resulting above-described organic mandrel-organic spacer combination presents a series of etch characteristics that can be used in a variety of patterning applications. Several of these pattern applications will now be discussed.

FIG. 3 shows a first patterning method utilizing the mandrel-spacer combination of the present invention. In this process, a plurality of conductive lines are defined from a layer of conductive material 14 disposed on the substrate 1. Etch-stop layers 12A, 12B are disposed on the conductive layer 14. After formation of the mandrel-spacer pair, the mandrel is removed by exposure to an etchant that does not appreciably attack the spacers. More specifically, it has been found that N-methylpyrollidone (NMP) will completely remove conventional photosensitive polymers without removing the parylene spacers. Similar results were achieved using sulfuric-nitric acid, dilute KOH after blanket exposure of the photoresist, and acetone. Thus, it would appear that the parylene spacers are impervious to all conventional photoresist solvents. Thus, as shown in FIG. 3, the spacers 20A remain to pattern the underlaying etch stop layers 12A, 12B. The patterned etch-stop layers subsequently serve as a mask to pattern the underlaying conductor layer 14. A more detailed description of the method of patterning the layers 12A, 12B and 14 after spacer definition is rendered in U.S. Pat. No. 4,648,937, entitled "Method of Preventing Asymmetric Etching of Lines in Sub-Micrometer Range Sidewall Image Transfer," issued Mar. 10, 1987, to Ogura et al and assigned to the assignee of the present invention, the teachings of which are incorporated herein by reference.

FIG. 4 presents a second patterning method utilizing the organic mandrel-organic spacer combination of the present invention. In this process, apertures are formed through a thick insulating layer 16 overlying the substrate 1. The insulating layer 16 can be undoped silicon oxide, phosphosilicate glass (PSG), boro-phosphosilicate glass (BPSG), or an organic resin such as polyimide. If the insulating layer 16 is made of undoped silicon oxide or glass, it can be patterned by exposure to a 92% $CF_4$/8% $O_2$ plasma. If the insulating layer 16 is polyimide, it can be patterned in the same $O_2$ plasma that defines the sidewall spacers 20A. In either instance, it has been found that parylene and conventional photoresist materials have equivalent etch rates. As a consequence of this equivalent etch rate in $O_2$ and $CF_4/O_2$ plasmas, the parylene-photoresist combination can be completely removed in the same ambient. During removal of the dashed portions of insulating layer 16, equivalent portions of the mandrel 10 and spacers 20A will be removed.

FIG. 5 presents a third patterning method utilizing the organic mandrel-organic spacer combination of the present invention. Similarly to the process shown in FIG. 4, apertures are defined in an insulating layer 16. In FIG. 5 the insulating layer 16 is etched under conditions such that horizontal portions of the masking structure are removed. The resulting apertures have sloped sidewalls. After spacers 20A are defined, the substrate is subjected to a $CF_4/O_2$ plasma in which oxygen constitutes 40%–60% of the total gas mixture. The etch chamber is held at a pressure of 40–70 milliTorr. Under these conditions, the mandrel-spacer combination is horizontally eroded. Spacers 20A are completely removed during the course of the etch. As the masking structure is horizontally eroded, portions of the underlaying insulating layer 16 are exposed to the etchant for different lengths of time. Consequently, the resulting apertures have sloped sidewalls (as compared to the vertical sidewalls resulting from the etch sequence described with reference to FIG. 4). Again, the above-described process makes use of the similarities in etch rate between the parylene spacers 20A and the organic resin mandrels 10 in gaseous plasmas.

As described with reference to the processes shown in FIG. 3-5, the organic mandrel-organic spacer combination of the invention presents a plurality of characteristics not provided by other mandrel-spacer combinations of the prior art. The spacers are defined in a gaseous plasma that does not appreciably attack underlaying oxide and/or nitride layers. The mandrels can be removed by exposure to wet solvents that do not remove the spacers. The mandrels and the spacers have equivalent etch rates in oxygen and halocarbon-based gaseous plasmas. Finally, the spacers present several beneficial materials characteristics (i.e., low deposition temperature and high conformality).

It will be apparent to those of skill in the art that while the above description has been rendered with reference a particular mode for carrying out the invention, various modifications may be made without departing from the ambit of the invention. For example, while the invention has been particularly described with reference to parylene, other organic materials that can be conformally deposited at room temperature will provide the same results as those described above. Similarly, while three process sequences utilizing the mandrel-spacer combination of the invention have been shown, other processes utilizing a mandrel-spacer combination may be practiced using the materials of the invention.

We claim:

1. A method for defining a masking structure on a substrate, comprising the steps of:
   defining a plurality of organic mandrels having substantially vertical sidewalls on the substrate;
   depositing a layer of parylene on the substrate and said mandrels; and
   anisotropically etching said layers of parylene so as to define spacers on said sidewalls of said mandrels; and
   exposing said spacers and said mandrels to dry etchants in which they posses analogous etch rates or to wet etchants in which they possess differing etch rates.

2. The method as recited in claim 1, wherein said dry etchants comprise gaseous plasmas selected from the group consisting of oxygen plasmas and halocarbon-based plasmas.

3. The method as recited in claim 2, wherein said wet etchant is selected from the group consisting of NMP, sulfuric-nitric, KOH, and acetone.

4. The method as recited in claim 3, wherein said mandrels are comprised of a photosensitive polymer.

* * * * *